(12) United States Patent  
Maki et al.

(10) Patent No.: US 6,774,441 B2  
(45) Date of Patent: Aug. 10, 2004

(54) SEMICONDUCTOR DEVICE HAVING AN MIS TRANSISTOR

(75) Inventors: Yukio Maki, Hyogo (JP); Yoshiyuki Ishigaki, Hyogo (JP); Yasuhiro Fujii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/340,731

(22) Filed: Jan. 13, 2003

(65) Prior Publication Data

US 2004/0026747 A1 Feb. 12, 2004

(30) Foreign Application Priority Data

Aug. 8, 2002 (JP) ........................................ 2002-231568

(51) Int. Cl.⁷ .............................................. H01L 29/78
(52) U.S. Cl. ........................ 257/384; 257/377; 257/382
(58) Field of Search ................................ 257/377, 382, 257/384, 388, 401

(56) References Cited

U.S. PATENT DOCUMENTS

| | | | | |
|---|---|---|---|---|
| 5,633,522 A | * | 5/1997 | Dorleans et al. | ............ 257/344 |
| 5,858,867 A | * | 1/1999 | Hsia et al. | ................... 438/592 |
| 6,180,472 B1 | * | 1/2001 | Akamatsu et al. | .......... 438/303 |
| 6,573,132 B1 | * | 6/2003 | Uehara et al. | ............... 438/211 |

FOREIGN PATENT DOCUMENTS

| | | | |
|---|---|---|---|
| EP | 0899792 A2 * | 3/1999 | ........... H01L/29/78 |
| JP | P2000-101069 A | 4/2000 | |

OTHER PUBLICATIONS

"High–Frequency AC Characteristics of 1.5nm Gate Oxide MOSFETS", Hisayo Sasaki Momose et al., IEDM 1996, pp. 105–108.

* cited by examiner

*Primary Examiner*—Allan R. Wilson  
(74) *Attorney, Agent, or Firm*—McDermott Will & Emery LLP

(57) ABSTRACT

A semiconductor device according to the present invention includes a silicon substrate having a main surface, a gate electrode provided on the main surface of the silicon substrate, a first sidewall insulating film provided to cover a side surface of the gate electrode and including two layers of an oxide sidewall film as an underlay and a nitride sidewall film, a second sidewall insulating film provided to cover a surface of the first sidewall insulating film, and a cobalt silicide layer arranged above source and drain regions and at a position farther than the second sidewall insulating film from the gate electrode. The second sidewall insulating film fills in a removed portion located at a lower end of the oxide sidewall film. This allows a semiconductor device formed by employing a salicide process to prevent increase of leak current caused by a metal silicide layer.

7 Claims, 9 Drawing Sheets

SEMICONDUCTOR DEVICE HAVING AN MIS TRANSISTOR

BACKGROUND OF THE INVENTION

1. Field of the Invention

The present invention relates to a semiconductor device having an MIS (Metal-Insulator Semiconductor) transistor, and more particularly, to a semiconductor device having an MIS transistor in which a metal silicide layer is formed on source and drain regions through application of a salicide process.

2. Description of the Background Art

In recent years, a salicide process is often used in manufacturing of a semiconductor device in order to increase the operating speed of the semiconductor device. The salicide process is to form a metal silicide layer in self alignment simultaneously on a gate electrode and on source and drain regions formed on a silicon substrate which is a semiconductor substrate. By employing such a process, the resistance in the source and drain regions can be lowered, while the operating speed of the MIS transistor can be increased.

In order to meet the recent demand of size reduction in semiconductor devices, a self align contact structure is coming to be essential. The self align contact structure is to form a sidewall insulating film or the like at an upper part or a side surface of the gate electrode, using a film having a high etching selectivity to an interlayer insulating film covering the gate electrode, to form a contact for a gate electrode in self alignment. The self align contact structure allows a microscopic contact to be formed with a good yield, enabling miniaturization of semiconductor devices.

In a semiconductor device in which the self align contact structure is employed, an insulating film comprised of two layers of a silicon oxide film and a silicon nitride film is often used as a sidewall insulating film. Here, the silicon nitride film is for ensuring a high etching selective ratio to the silicon oxide film of an interlayer insulating film at opening of a contact hole. The silicon oxide film serves as an underlay for relieving intrinsic stress occurring when the silicon nitride film is deposited directly on the gate electrode or silicon substrate. Moreover, the silicon oxide film is less likely to capture hot carriers compared to the silicon nitride film, so that it may be interposed between the silicon nitride film and the silicon substrate surface to improve the electrical characteristics and reliability of the MIS transistor. It is noted that reduction of the width of the sidewall insulating film is increasingly required so as to conform to miniaturization of semiconductor devices.

In general, the silicon substrate also includes thereon an MIS transistor in which no metal silicide layer is formed. An example thereof is an MIS transistor used for an input/output circuit, which has no metal silicide layer formed on the source and drain regions so as to ensure the gate oxide film resistance and the ESD (Electrostatic Discharge) resistance. Thus, both a circuit region in which a metal silicide layer is formed and a circuit region in which no metal silicide layer is formed are present on the same semiconductor substrate.

FIGS. 12 to 16 show process steps of a method of manufacturing a conventional semiconductor device that has the self align contact structure described above and that employs the salicide process. FIG. 17 is a section view showing the structure of the conventional semiconductor device manufactured by the method. It is noted that the section shown in the drawings is of the circuit region in which a metal silicide layer is formed, and the circuit region in which no metal silicide layer is formed is not shown.

First, as shown in FIG. 12, a silicon oxide film 2a which is to be a gate insulating film of the MIS transistor is deposited, and a polysilicon film is further deposited thereon, which is patterned by a photolithography technique, to form a gate electrode 3. Next, ions are implanted into a main surface of silicon substrate 1 at positions where gate electrode 3 is arranged in between, to form LDD (Lightly Doped Drain) regions 4a, 5a that are n$^-$-type diffusion regions having relatively shallow junction depths. LDD regions 4a, 5a are diffusion regions that are to be a part of source and drain regions.

Subsequently, as shown in FIG. 13, silicon oxide film 6a and silicon nitride film 7a are sequentially deposited on the entire main surface of silicon substrate 1 so as to cover gate electrode 3. Here, silicon oxide film 6a serves as an underlay of silicon nitride film 7a.

Subsequently, silicon nitride film 7a and silicon oxide film 6a are etched back by anisotropic etching, to form a sidewall insulating film 8 at a side surface of gate electrode 3, as shown in FIG. 14. Here, sidewall insulating film 8 is comprised of two layers of an oxide sidewall film 6 having an L-shaped section and a nitride sidewall film 7 arranged thereon. Further, the side surface of gate electrode 3 and the main surface of silicon substrate 1 are both covered with oxide sidewall film 6.

Next, as shown in FIG. 14, ions are implanted into the main surface of silicon substrate 1, using sidewall insulating film 8 and gate electrode 3 as a mask, to form heavily-doped source region 4b and heavily-doped drain region 5b that are n$^+$-type diffusion regions to be a part of the source and drain regions. It is noted that heavily-doped source region 4b and heavily-doped drain region 5b are diffusion regions having junction depths greater than those of LDD regions 4a, 5a.

Before forming a metal silicide layer on source and drain regions 4, 5, an insulating film, which is to be a silicide-formation preventing film for preventing silicidation of the MIS transistor arranged in a circuit region in which no metal silicide layer is to be formed, is deposited on the entire main surface of silicon substrate 1. Thus, as shown in FIG. 15, the MIS transistor in which a metal silicide layer is to be formed is also covered with silicide-formation preventing film 9. A silicon oxide film is generally used for silicide-formation preventing film 9 deposited here, having a certain degree of thickness (e.g. at least 50 nm) in order to prevent a reaction in the circuit region in which no metal silicide layer is to be formed.

Next, as shown in FIG. 16, silicide-formation preventing film 9 on the MIS transistor in which a metal silicide layer is to be formed is removed. Here, sufficient etching is performed so as to completely remove silicide-formation preventing film 9 in the circuit region in which a metal silicide layer is to be formed. This is because residue of silicide-formation preventing film 9 due to insufficient etching would hinder formation of a metal silicide layer.

In the etching process of silicide-formation preventing film 9, a film thickness of silicide-formation preventing film 9 is relatively thick, increasing the amount of over etching for the film thickness, resulting in a large amount of etching in total. Thus, wet etching or the combination of dry and wet etching is used to remove silicide-formation preventing film 9, since dry etching alone would have higher possibility of causing a damage on the MIS transistor. This partially removes a lower end of oxide sidewall film 6 having an L-shaped section which is a part of sidewall insulating film 8, producing a removed-portion 6d as shown in FIG. 16.

Next, to form a metal silicide layer, a cobalt (Co) layer is deposited over the entire main surface of silicon substrate 1, which is then subjected to thermal treatment. This allows an Si atom to react with a Co atom at the interface between silicon substrate 1 and the cobalt layer, which forms cobalt suicide layers 10, 11 consisting of $CoSi_2$ simultaneously on gate electrode 3 and on source and drain regions 4, 5.

Subsequently, an unreacted cobalt layer is removed to form an MIS transistor having a reduced size by the self-align contact structure and an increased operating speed by a so-called salicide structure.

The semiconductor device manufactured by the conventional manufacturing method, however, had the following problems.

As described above, in the process of removing the silicide-formation preventing film, a lower end of oxide sidewall film 6 having an L-shaped section which is a part of sidewall insulating film 8 is removed, producing removed portion 6d, as shown in FIG. 16. Thus, the upper surfaces of LDD regions 4a, 5a that are a part of source and drain regions 4, 5 are exposed. As a result, in the subsequent step of forming a cobalt silicide layer, cobalt silicide layer 10 laterally grows along the main surface of silicon substrate 1. That is, the upper surfaces of LDD regions 4a, 5a are silicidated, providing contact between an end of cobalt silicide layer 10 and LDD regions 4a, 5a. If removed portion 6d resulting from over etching is large, a depletion layer occurring in LDD regions 4, 5 at operation of the MIS transistor may touch cobalt silicide layer 10, causing a leak. Further, in the worst case, cobalt silicide layer 10 may penetrate through LDD regions 4a, 5a, reaching a p-well region at a lower layer.

Moreover, by the thermal treatment at the process of forming interconnections performed after formation of cobalt silicide layer 10, cobalt silicide layer 10 arranged on source and drain regions 4, 5 may grow toward the silicon substrate 1 side, forming an island shape, which may cause a phenomenon called "aggregation" producing an uneven or discontinuous film. As for the aggregation, a wedge-shaped aggregation portion 12 often occurs that extends from source and drain regions 4, 5 arranged between gate electrodes 3 toward the silicon substrate 1 side, as shown in FIG. 18. If wedge-shaped aggregation portion 12 grows to a degree that touches the depletion layer occurring at source and drain regions 4, 5 at operation of the MIS transistor, leak current increases. Further, if wedge-shaped aggregation portion 12 penetrates through source and drain regions 4, 5, to reach the p-well region as illustrated, short-circuit occurs. Accordingly, junction depths of heavily-doped source and drain regions 4b, 5b may possibly be made deeper than usual, which however is not favorable because the punch through characteristic of the MIS transistor may be deteriorated.

SUMMARY OF THE INVENTION

An object of the present invention is to provide a semiconductor device formed by employing a salicide process, which can prevent increase of leak current caused by a metal silicide layer.

According to one aspect of the present invention, a semiconductor device includes a semiconductor substrate, a gate electrode, first and second sidewall insulating films, source and drain regions, and a metal silicide layer. The gate electrode is provided on a main surface of the semiconductor substrate with an insulating film interposed. The first sidewall insulating film is provided to cover a side surface of the gate electrode, and including two layers of a silicon oxide film serving as an underlay and having a lower end partially removed, and a silicon nitride film arranged on the silicon oxide film. The second sidewall insulating film is provided to cover a surface of the first sidewall insulating film and to fill in a removed portion of the silicon oxide film. The source and drain regions are provided at positions on a main surface of the semiconductor substrate where the gate electrode is arranged in between. The metal silicide layer is arranged above the source and drain regions and at a position farther than the second sidewall insulating film from the gate electrode.

According to the second aspect of the present invention, a semiconductor device includes a semiconductor substrate, a gate electrode, source and drain regions, and a metal silicide layer. The gate electrode is provided on the main surface of the semiconductor substrate with an insulating film interposed. The source and drain regions are provided at positions on the main surface of the semiconductor substrate where the gate electrode is arranged in between. The metal silicide layer is arranged above the source and drain regions. The source and drain regions includes a first diffusion region formed to have a first depth from the main surface of the semiconductor substrate, a second diffusion region formed to have a second depth greater than the first depth, and a third diffusion region arranged below a middle portion of the metal silicide layer and formed to have a third depth greater than the second depth.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Embodiment

Figure 1:
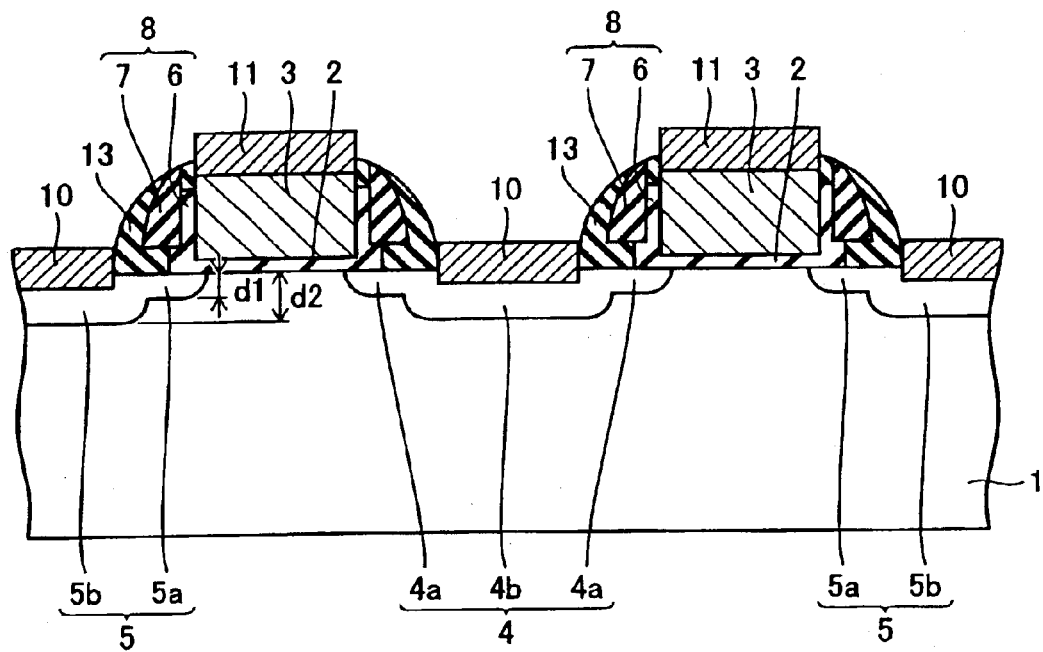
FIG. 1 is a section view showing the structure of a semiconductor device according to the first embodiment of the present invention.

First, the structure of a semiconductor device according to the first embodiment of the present invention will be described with reference to FIG. 1. It is noted that only the MIS transistors in a circuit region in which a metal silicide layer is formed is illustrated, while a circuit region not provided with a metal silicide layer is not shown. As shown in FIG. 1, the semiconductor device according to the first embodiment includes a gate electrode 3 on a main surface of p-type silicon substrate 1 which is a semiconductor substrate, with a gate oxide film 2 which is a gate insulating film interposed. The gate electrode is made of polysilicon, the upper surface of which is covered with a cobalt silicide layer 11 which is a metal silicide layer.

A side surface of gate electrode 3 is covered with a first sidewall insulating film 8. First sidewall insulating film 8 is comprised of two layers of oxide sidewall film 6 having an L-shaped section that serves as an underlay, and nitride sidewall film 7 arranged thereon. A lower end of oxide sidewall film 6 as an underlay is partially removed.

The surface of first sidewall insulating film 8 is covered with a second sidewall insulating film 13. Thus, the removed portion described above is also filled with second sidewall insulating film 13. Second sidewall insulating film 13 is made of e.g. a silicon nitride film. This ensures a high etching selective ratio to a silicon oxide film which is an interlayer insulating film in the subsequent step of forming a contact, allowing the contact to be formed in self alignment.

Source and drain regions 4 and 5 are provided at positions on the main surface of silicon substrate 1 where gate electrode 3 is arranged in between. Source and drain regions 4, 5 include, respectively, n⁻-type LDD regions 4a, 5a that are the first diffusion regions formed to have a depth d1 from the main surface of silicon substrate 1, and n⁺-type heavily-doped source region 4b and heavily-doped drain region 5b that are the second diffusion regions formed to have a depth d2 greater than depth d1.

Cobalt silicide layer 10 which is a metal silicide layer is arranged on source and drain regions 4, 5. Cobalt silicide layer 10 is located farther than second sidewall insulating film 13 from gate electrode 3, and has an end being in contact with second sidewall insulating film 13.

Next, a method of manufacturing the semiconductor device having the structure above will be described with reference to FIGS. 2 and 3. The method of manufacturing the semiconductor device according to the present embodiment goes through the process steps similar to those shown in FIGS. 12 to 16 described in the conventional example, followed by the steps illustrated in FIGS. 2 and 3. Description of the steps shown in FIGS. 12 to 16 will, therefore, not be repeated here in order to avoid redundancy.

Figure 2:
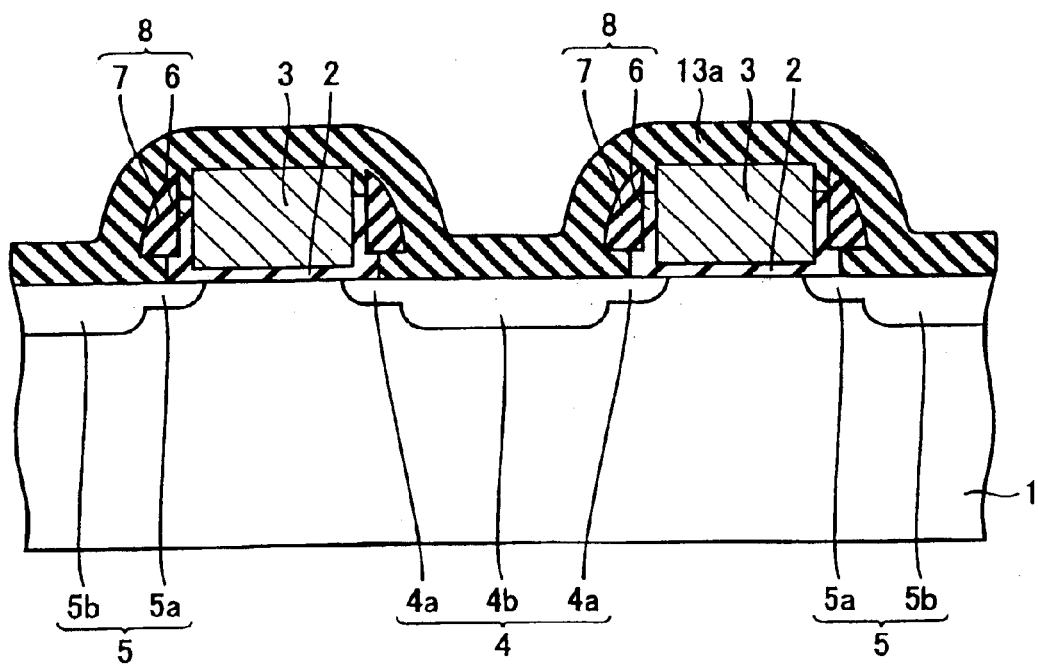
FIGS. 2 and 3 illustrate a method of manufacturing the semiconductor device according to the first embodiment of the present invention.
Figure 16:
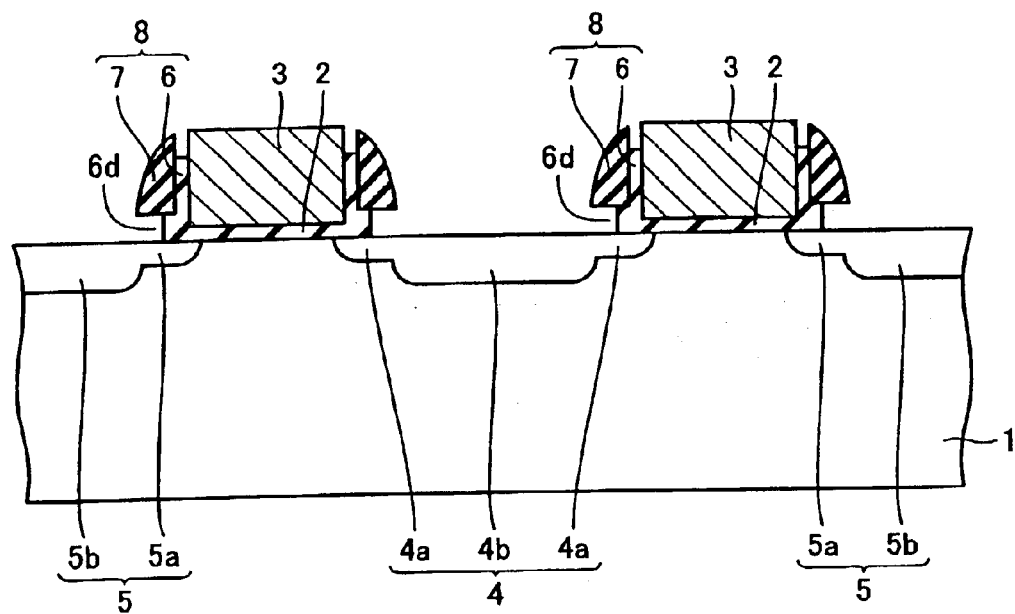
Figure 17:
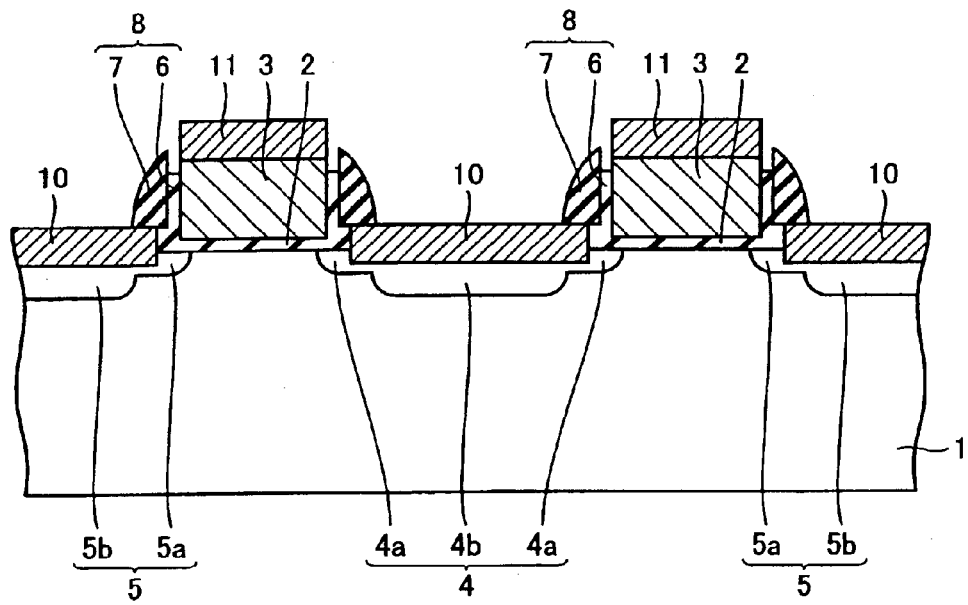
FIG. 17 is a section view showing the structure of the semiconductor device in the conventional example.
Figure 18:
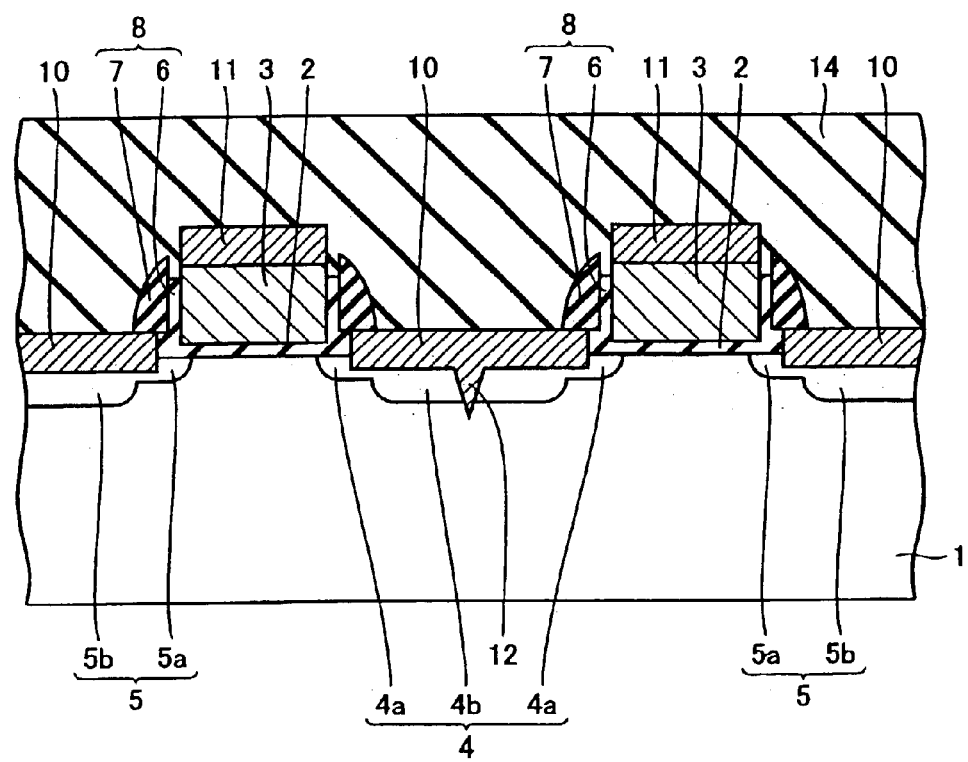
FIG. 18 is a section view showing the semiconductor device in the conventional example in which wedge-shaped aggregation occurs at a metal silicide layer.

As shown in FIG. 2, a silicon nitride film 13a which is to be a second sidewall insulating film is deposited over the entire main surface of silicon substrate 1 of a semiconductor device having a section as shown in FIG. 16, by e.g. a CVD (Chemical Vapor Deposition) method. Here, silicon nitride film 13a is deposited so as to fill in removed portion 6d corresponding to the lower end of the oxide sidewall film removed by over etching at removal of the silicide-formation preventing film (see FIG. 16).

Figure 3:
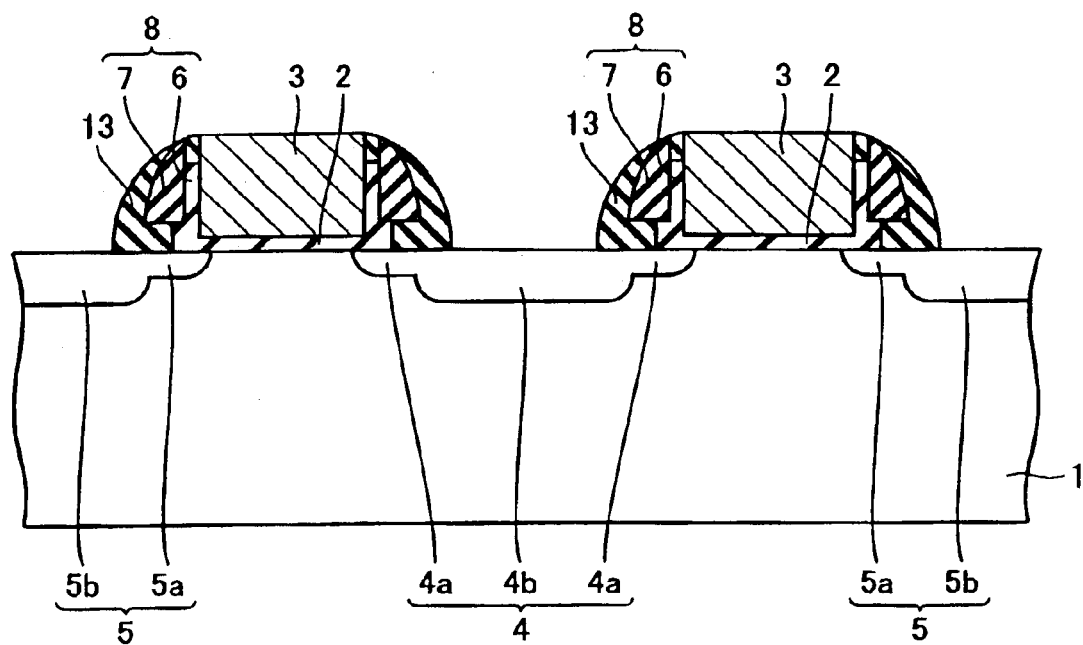

Subsequently, as shown in FIG. 3, silicon nitride film 13a is etched back to form second sidewall insulating film 13 so as to cover the surface of first sidewall insulating film 8. Thereafter, as in the conventional manufacturing method, a cobalt layer is deposited over the entire main surface of silicon substrate 1, which is subjected to thermal treatment to form cobalt silicide layers 10, 11. An unreacted cobalt layer is then removed. Accordingly, the semiconductor device having the structure as shown in FIG. 1 is obtained.

Thus, the semiconductor device having the structure above can be manufactured by the steps of (a) forming a gate electrode on the main surface of the semiconductor substrate with an insulating film interposed, (b) forming a first diffusion region which is to be a part of source and drain regions at positions on the main surface of the semiconductor substrate where the gate electrode is arranged in between so as to have the first depth from the main surface of the semiconductor substrate, using the gate electrode as a mask, (c) forming a first sidewall insulating film comprised of two layers of a silicon oxide film serving as an underlay and a silicon nitride film so as to cover a side surface of the gate electrode, (d) forming a second diffusion region which is to be a part of the source and drain regions so as to have the second depth greater than the first depth, using the first sidewall insulating film as a mask, (e) depositing a silicide-formation preventing film so as to cover the first sidewall insulating film and removing the silicide-formation preventing film under the over etching condition, (f) forming a second sidewall insulating film so as to cover the surface of the first sidewall insulating film, and (g) setting a portion above the source and drain regions as a metal silicide layer after formation of the second sidewall insulating film.

According to the semiconductor device having the structure above or the method of manufacturing the same, the removed portion of the oxide sidewall film occurring at removal of the silicide-formation preventing film can be covered with the second sidewall insulating film, preventing the subsequently-formed metal silicide layer from reaching the LDD region which is a part of the source and drain regions. That is, the second sidewall insulating film keeps the metal silicide film from touching the LDD region, preventing increase of the leak current as occurred in the conventional example. This enables manufacturing of a semiconductor device with a good yield and provision of a semiconductor device with excellent electrical characteristics and high reliability.

Figure 4:
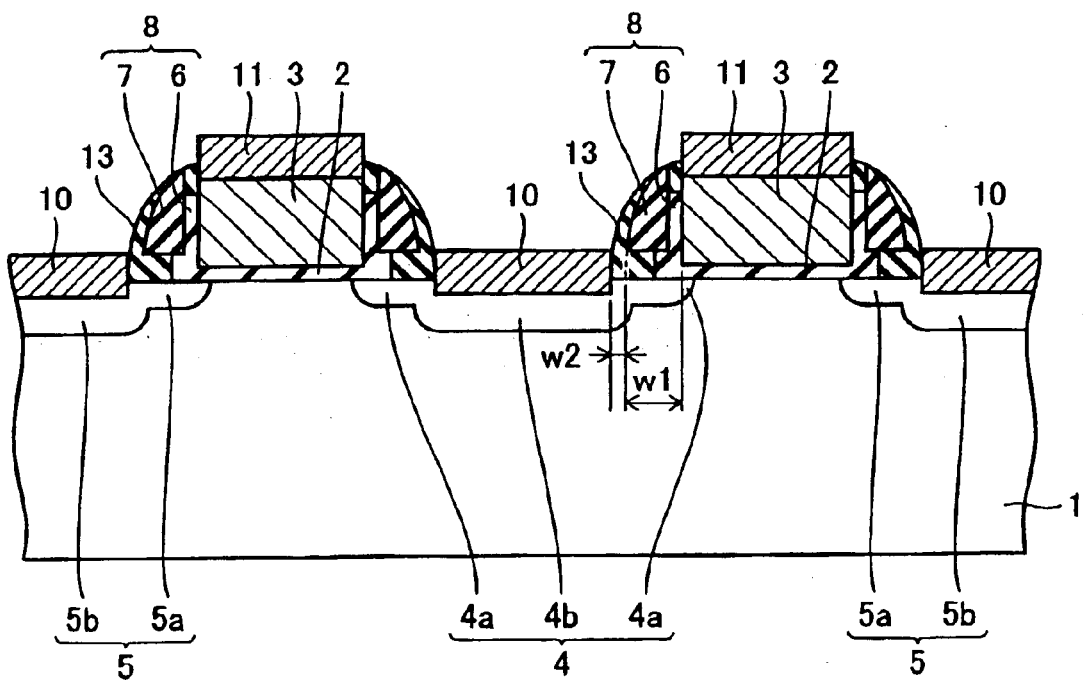
FIG. 4 is a section view showing a modification of the semiconductor device according to the first embodiment of the present invention.

It is noted that, as shown in FIG. 4, the semiconductor device according to the present embodiment is desirably set to have a width w2 of second sidewall insulating film 13 smaller than a width w1 of first sidewall insulating film 8. This is because, according to the present embodiment, second sidewall insulating film 13 is formed before formation of cobalt silicide layer 10, and cobalt silicide layer 10 can be formed larger by setting width w2 small. This can further reduce the parasitic resistance of the source and drain. Width w2 of second sidewall insulating film 13 may preferably be as thin as possible if it is sufficient to fill in the removed portion of oxide sidewall film 6, and may have, for example, at least a half the thickness of first sidewall insulating film 8.

Second Embodiment

Figure 5:
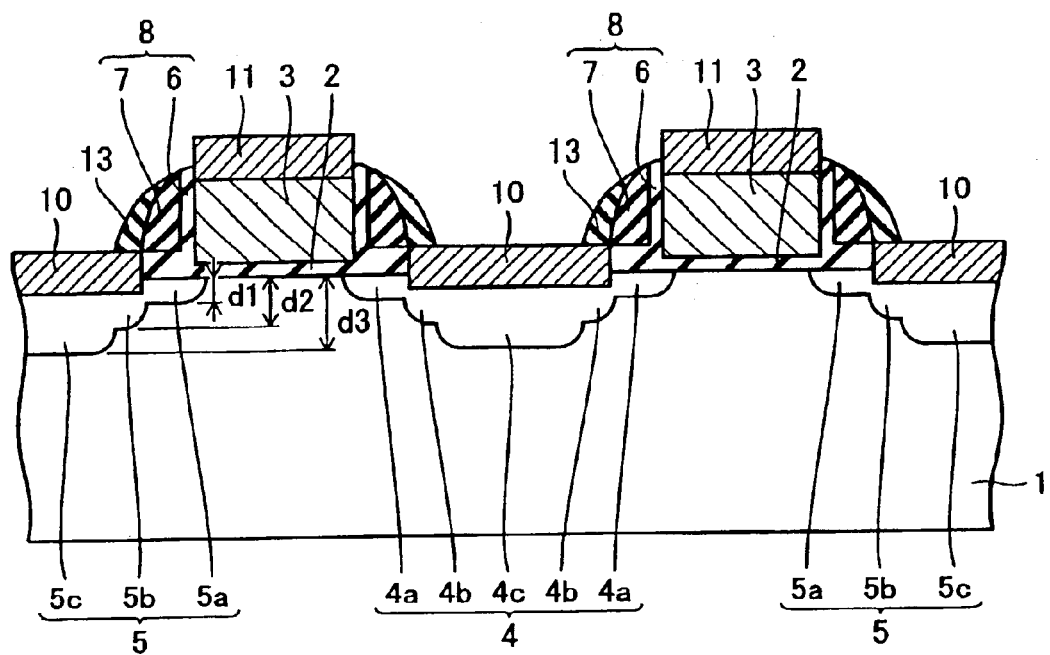
FIG. 5 is a section view showing the structure of a semiconductor device according to the second embodiment of the present invention.

First, the structure of a semiconductor device according to the second embodiment of the present invention will be described with reference to FIG. 5. It is noted that the portions similar to those in the first embodiment are denoted by the same reference characters in the drawings, and the description thereof will not be repeated. The semiconductor device according to the present embodiment includes, as in the first embodiment, second sidewall insulating film 13 so as to cover the surface of first sidewall insulating film 8. Cobalt silicide layer 10 located on source and drain regions 4, 5, however, passes the lower part of second sidewall insulating film 13 and reaches first sidewall insulating film 8.

Source and drain regions 4, 5 formed at positions on the main surface of silicon substrate 1 where gate electrode 3 is arranged in between include, respectively, n$^-$-type LDD regions 4a, 5a that are the first diffusion regions formed to have depth d1 from the main surface of silicon substrate 1, n$^+$-type heavily-doped source region 4b and heavily-doped drain region 5b that are the second diffusion regions formed to have depth d2 greater than depth d1, and n$^+$-type leak-current-reducing diffusion regions 4c, 5c that are the third diffusion regions formed to have depth d3 greater than depth d2. Leak-current-reducing diffusion regions 4c, 5c are diffusion regions locally extending downward to depth d3 that is lower than the junction surface with the p-well region located at a lower part of heavily-doped source region 4b and heavily-doped drain region 5b.

Next, a method of manufacturing the semiconductor device having the structure above will be described with reference to FIGS. 6 to 8. The method of manufacturing the semiconductor device in the present embodiment goes through the process steps similar to those shown in FIGS. 12 to 16 as described in the conventional example, followed by the process steps shown in FIGS. 6 to 8. Thus, description of the steps shown in FIGS. 12 to 16 will not be repeated here in order to avoid redundancy.

Figure 6:
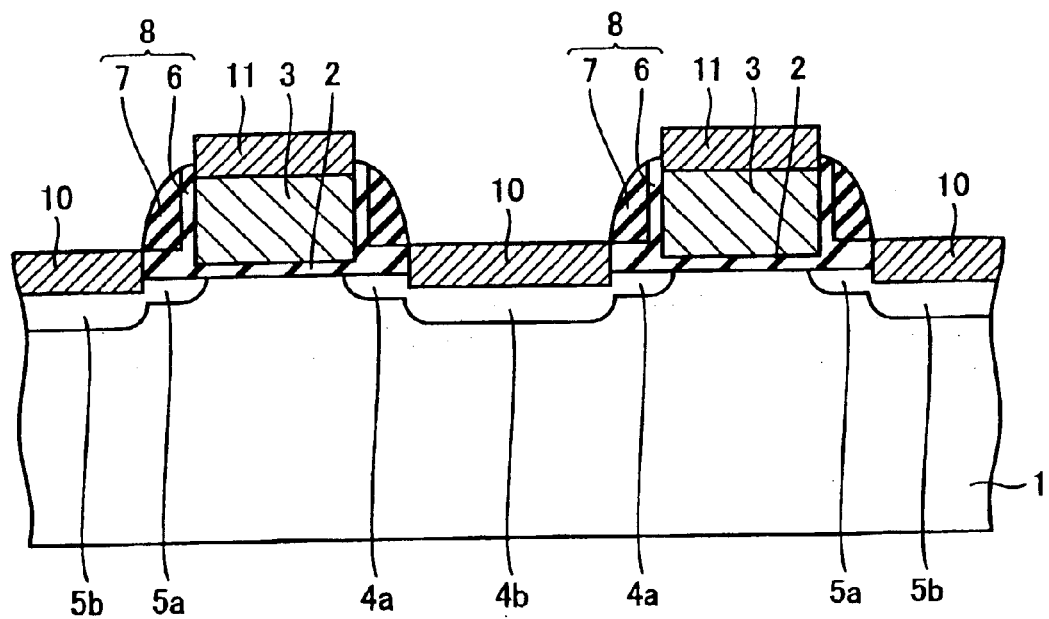
FIGS. 6 to 8 illustrate a method of manufacturing the semiconductor device according to the second embodiment of the present invention.

As shown in FIG. 6, a cobalt layer is deposited on the entire main surface of silicon substrate 1 of the semiconductor device having the section shown in FIG. 16, which is subjected to thermal treatment to form silicide layers 10, 11. An unreacted cobalt layer is then removed.

Figure 7:
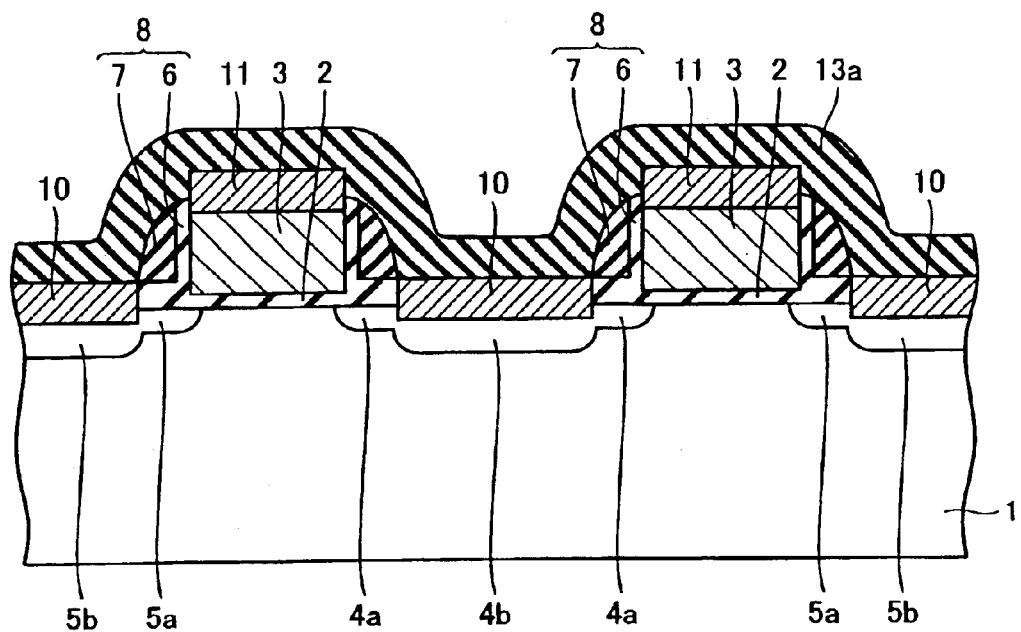

Subsequently, as shown in FIG. 7, silicon nitride film 13a which is to be the second sidewall insulating film is deposited over the entire main surface of silicon substrate 1 by e.g. an atmospheric CVD method. This is to prevent aggregation of salicide due to exposure to a high temperature, since the step of depositing silicon nitride film 13a is performed after formation of cobalt silicide layers 10, 11.

Figure 8:
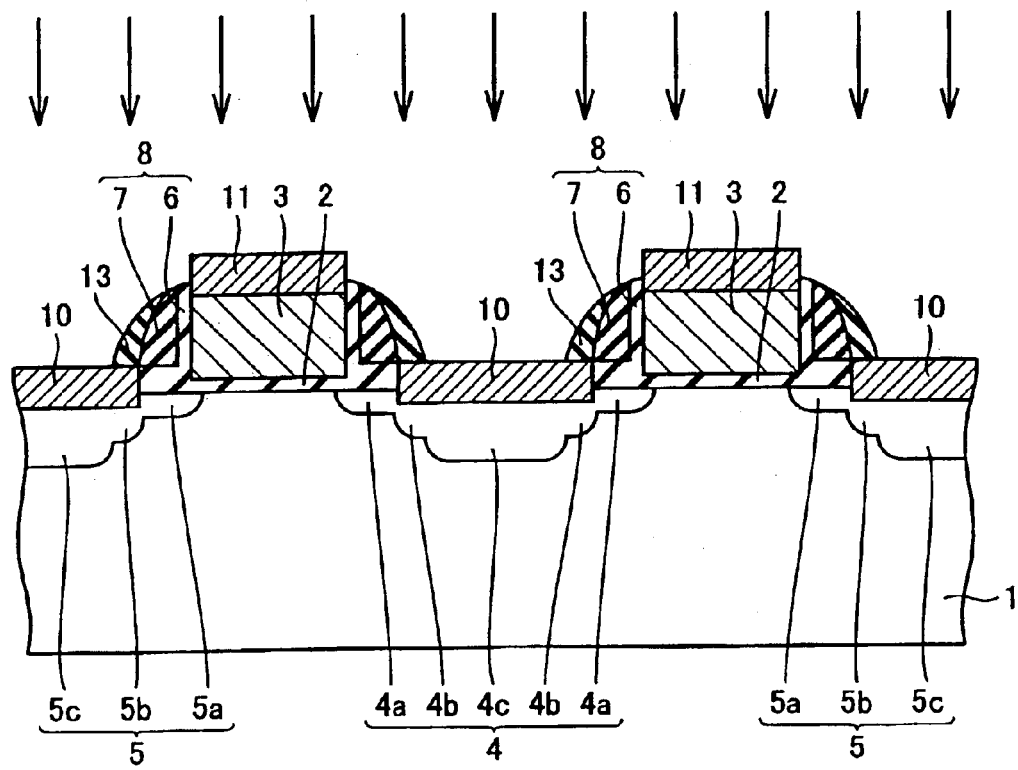

Subsequently, as shown in FIG. 8, silicon nitride film 13a is etched back to form second sidewall insulating film 13 so as to cover the surface of first sidewall insulating film 8. Thereafter, ions are implanted into the main surface of silicon substrate 1 through cobalt silicide layer 10, using second sidewall insulating film 13, first sidewall insulating film 8 and gate electrode 3 as a mask, to locally form leak-current-reducing diffusion regions 4c, 5c below heavily-doped source region 4b and heavily-doped drain region 5b. Accordingly, the semiconductor device having the structure as shown in FIG. 5 is obtained.

Thus, the semiconductor device having the structure above can be manufactured by the steps of (a) forming a gate electrode on the main surface of the semiconductor substrate with an insulating film interposed, (b) forming a first diffusion region which is to be a part of source and drain regions at positions on the main surface of the semiconductor substrate where the gate electrode is arranged in between, to have a first depth from the main surface of the semiconductor substrate, (c) forming a first sidewall insulating film so as to cover the side surface of the gate electrode, (d) forming the second diffusion region which is to be a part of the source and drain regions so as to have a second depth greater than the first depth, using the first sidewall insulating film as a mask, (e) setting a portion above the source and drain regions as a metal silicide layer, and (f) forming the second sidewall insulating film so as to cover the surface of the first sidewall insulating film after formation of the metal silicide layer, and (g) forming a third diffusion region which is to be a part of the source and drain regions so as to have a third depth greater than the second depth, using the second sidewall insulating film as a mask.

According to the semiconductor device having the structure above or the method of manufacturing the same, even if wedge-shaped aggregation of silicide occurs upon the thermal treatment at the step of e.g. forming interconnections performed after formation of the cobalt silicide layer, the leak-current-reducing diffusion region would have a high possibility of preventing contact between the depletion layer occurring at the operation of the MIS transistor and the wedge-shaped aggregation portion of silicide. That is, provision of the leak-current-reducing diffusion region ensures a large margin so as to prevent increase of leak current even if wedge-shaped aggregation occurs. This allows manufacturing of a semiconductor device with a good yield and provision of a semiconductor device having excellent electric characteristics and high reliability.

In addition, according to the present embodiment, the leak-current-reducing diffusion region is locally formed only at the lower end of the source and drain regions corresponding to a middle portion where aggregation of silicide likely occurs, using the second sidewall insulating film as a mask, thereby preventing deterioration of the punch through characteristic, and allowing both miniaturization of the semiconductor device and reduction of the leak current.

Figure 9:
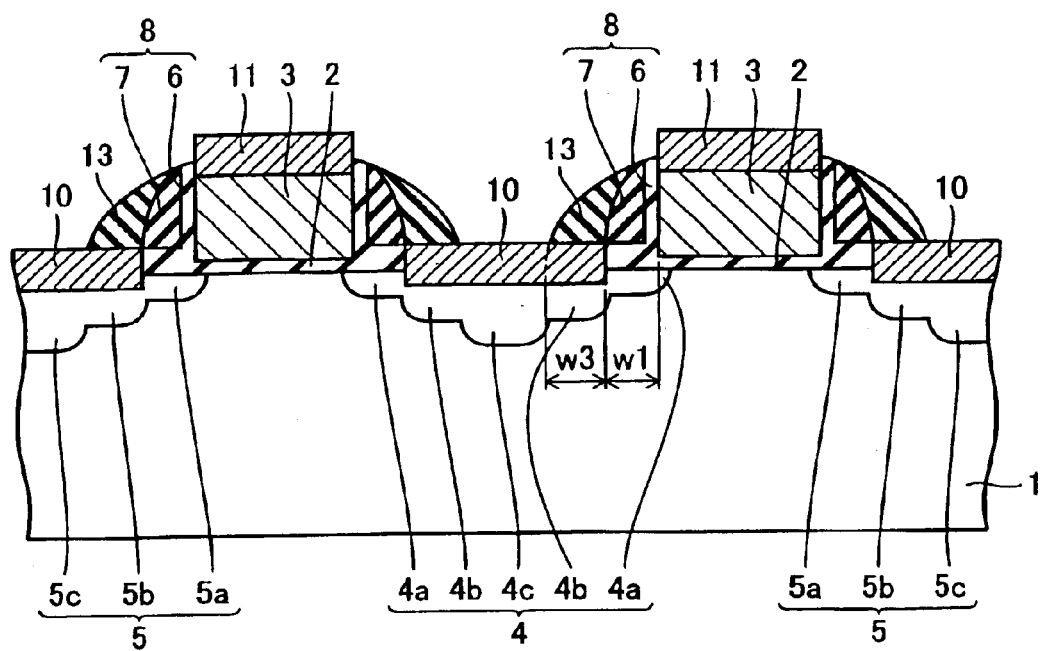
FIG. 9 is a section view showing a modification of the semiconductor device according to the second embodiment of the present invention.

It is noted that, as shown in FIG. 9, the semiconductor device according to the present embodiment is desirably set to have a width w3 of second sidewall insulating film 13 larger than width w1 of first sidewall insulating film 8. This is because width w3 of second sidewall insulating film 13 has no effect on the parasitic resistance of the source and drain, since second sidewall insulating film 13 is formed after formation of cobalt silicide layer 10. As a result, width w3 of second sidewall insulating film 13 may be made as thick as possible such that the leak-current-reducing diffusion region is more locally provided in order to prevent deterioration of the punch through characteristic.

Third Embodiment

Figure 10:
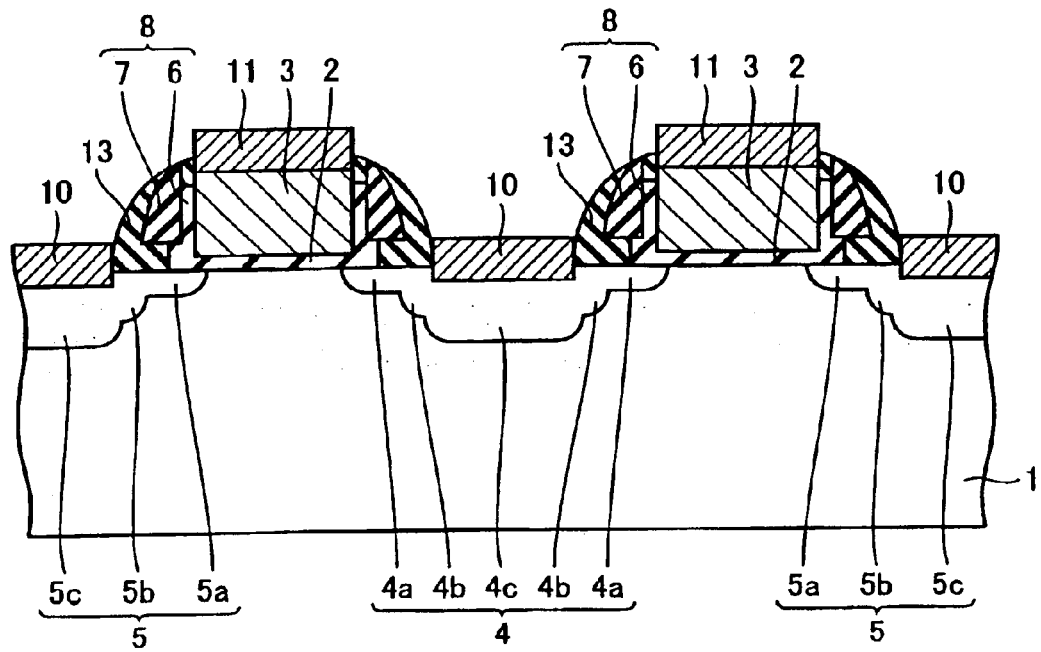
FIG. 10 is a section view showing the structure of a semiconductor device according to the third embodiment of the present invention.

First, the structure of a semiconductor device according to the third embodiment of the present invention will be described with reference to FIG. 10. It is noted that the portions similar to those in the first and second embodiments are denoted by the same number in the drawings, and the description thereof will not be repeated. The semiconductor device according to the present embodiment includes, as in the first embodiment, second sidewall insulating film 13 so as to cover the surface of first sidewall insulating film 8. It is noted that the removed portion located at the lower end of the oxide sidewall film as an underlay forming first sidewall insulating film 8 is also filled with second sidewall insulating film 13. Moreover, cobalt silicide layer 10 arranged on source and drain regions 4, 5 is positioned farther than second sidewall insulating film 13 from gate electrode 3, and has an end being in contact with second sidewall insulating film 13.

Moreover, the semiconductor device according to the present embodiment has a source and drain structure similar to that in the second embodiment above. That is, source and drain regions 4, 5 formed at positions on the main surface of silicon substrate 1 where gate electrode 3 is arranged in between include, respectively, n$^-$-type LDD regions 4a, 5a that are the first diffusion regions formed to have depth d1 from the main surface of silicon substrate 1, n$^+$-type heavily-doped source region 4b and heavily-doped drain region 5b that are the second diffusion regions formed to have depth d2 greater than depth d1, and n⁺-type leak-current-reducing diffusion regions 4c, 5c that are the third diffusion regions formed to have depth d3 greater than depth d2. Leak-current-reducing diffusion regions 4c, 5c are diffusion regions locally extending downward to depth d3 that is lower than the junction surface with the p-type well region located at a lower part of heavily-doped source region 4b and heavily-doped drain region 5b.

Figure 11:
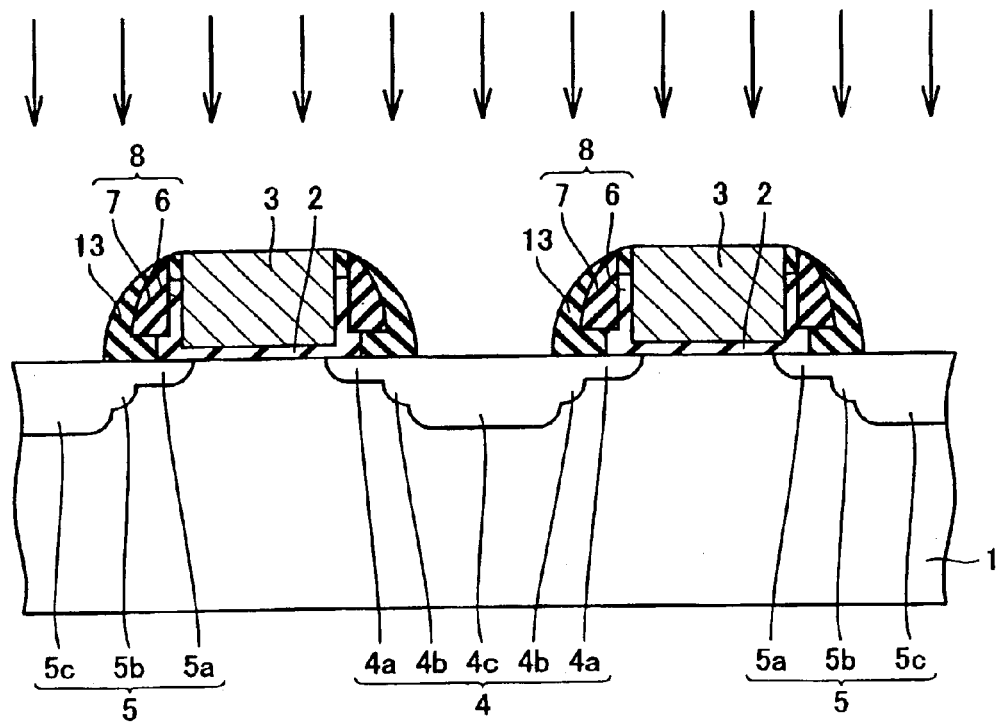
FIG. 11 illustrates a method of manufacturing the semiconductor device according to the third embodiment of the present invention.
Figure 12:
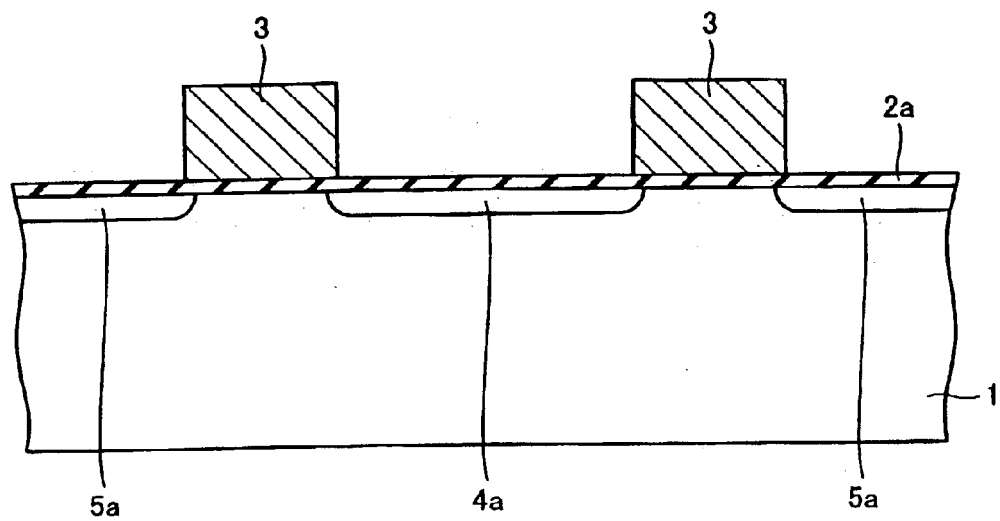
FIGS. 12 to 16 show the first to fifth process steps in the method of manufacturing the semiconductor device in the conventional example.
Figure 13:
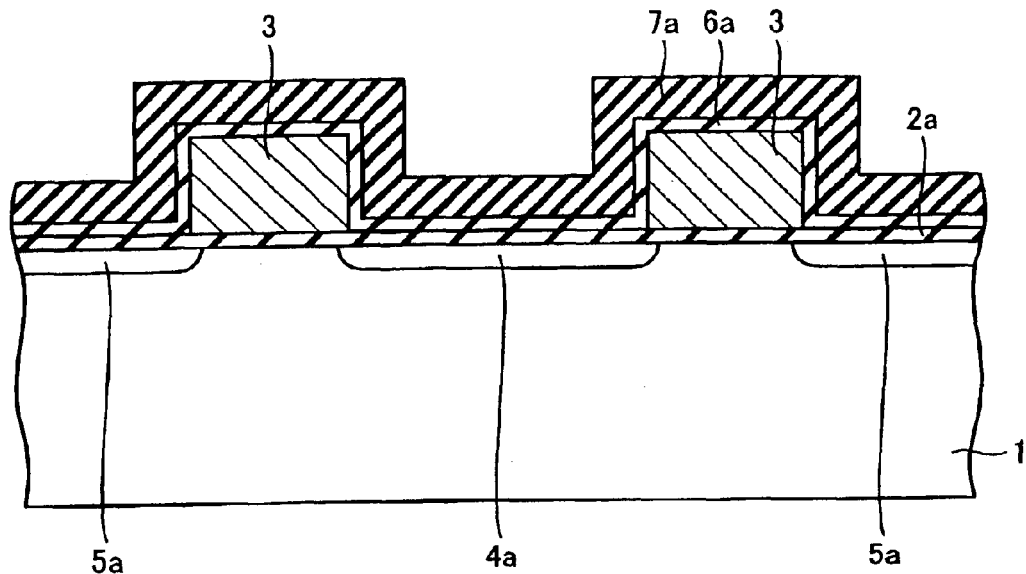
Figure 14:
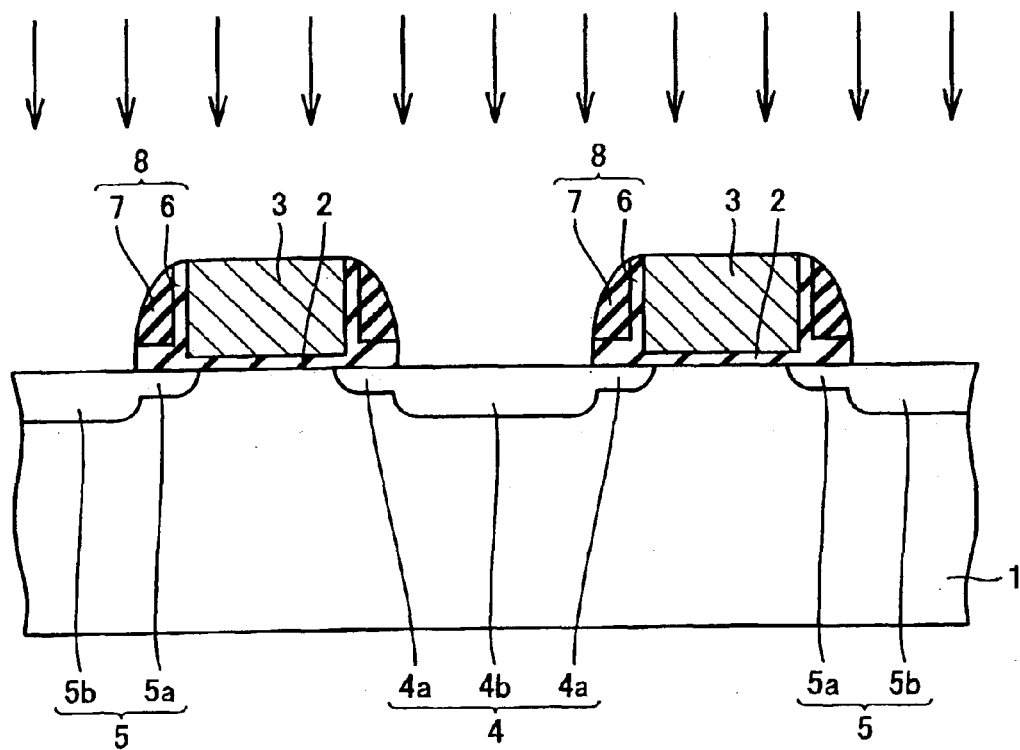
Figure 15:
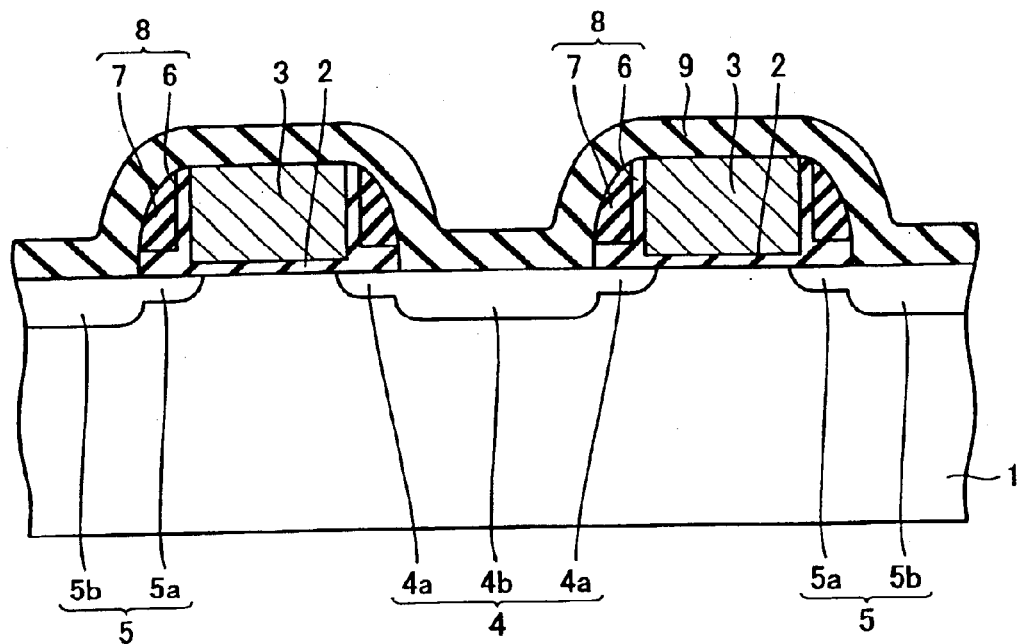

Next, a method of manufacturing the semiconductor device having the structure above will be described with reference to FIG. 11. The method of manufacturing the semiconductor device according to the present embodiment involves the same process steps as the ones described in the first embodiment up to the process shown in FIG. 3. The process shown in FIG. 11 is performed after the process shown in FIG. 3. Thus, description of the process steps before the one shown in FIG. 11 will not be repeated here in order to avoid redundancy.

As shown in FIG. 11, ions are implanted into the main surface of silicon substrate 1 of the semiconductor device having the section shown in FIG. 3, using second sidewall insulating film 13, first sidewall insulating film 8 and gate electrode 3 as a mask, to locally form leak-current-reducing diffusion regions 4c, 5c below heavily-doped source region 4b and heavily-doped drain region 5b. Subsequently, the process shown in FIG. 4 is performed. Accordingly, the semiconductor device having the structure as shown in FIG. 10 is obtained.

According to the semiconductor device having the structure above or the method of manufacturing the same, the effects obtained by the first and second embodiments can be obtained at the same time. That is, increase of leak current due to contact between the cobalt silicide layer and the LDD region, and due to occurrence of silicide aggregation can simultaneously be prevented. This allows manufacturing of a semiconductor device with a good yield and provision of a semiconductor device having excellent electric characteristics and high reliability.

While an n-type MOS transistor was illustrated as an example of a semiconductor device in the embodiments above, it is not particularly limited thereto, and a p-type MOS transistor may of course be applied to the present invention. Furthermore, a semiconductor device having an LDD structure was described by way of illustration in the embodiments above, it is not particularly limited thereto, and the present invention may effectively be applied to a semiconductor device without the LDD structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a semiconductor substrate having a main surface;
a gate electrode provided on a main surface of said semiconductor substrate with an insulating film interposed;
a first sidewall insulating film having two layers: a first layer of silicon oxide on a side surface of said gate electrode and having a lower portion extending on the main surface of said semiconductor substrate; and a second layer of silicon nitride on said silicon oxide film and having a lower surface over the lower portion of the first layer of silicon oxide;
a second sidewall insulating film provided to cover a surface of said first sidewall insulating film and having a lower part extending under the lower surface of the second layer of silicon nitride to fill in a removed portion of said silicon oxide film;
source and drain regions provided at positions on a main surface of said semiconductor substrate where said gate electrode is arranged in between; and
a metal silicide layer arranged above said source and drain regions and at a position farther than said second sidewall insulating film from said gate electrode.

2. The semiconductor device according to claim 1, wherein said second sidewall insulating film is a silicon nitride film.

3. The semiconductor device according to claim 1, wherein
said source and drain regions include
a first diffusion region formed to have a first depth from the main surface of said semiconductor substrate, using said gate electrode as a mask, and
a second diffusion region formed to have a second depth greater than said first depth, using said first sidewall insulating film as a mask.

4. The semiconductor device according to claim 3, wherein
said source and drain regions further include a third diffusion region arranged below a middle portion of said metal silicide layer and formed to have a third depth larger than said second depth, using said second sidewall insulating film as a mask.

5. A semiconductor device, comprising:
a semiconductor substrate having a main surface;
a gate electrode provided on the main surface of said semiconductor substrate with an insulating film interposed;
source and drain regions provided at positions on the main surface of said semiconductor substrate where said gate electrode is arranged in between; and
a metal silicide layer arranged above said source and drain regions,
said source and drain regions including a first lightly doped diffusion region formed to have a first depth from the main surface of said semiconductor substrate, a second heavily doped diffusion region formed to have a second depth greater than said first depth, and a third heavily doped diffusion region arranged below a middle portion of said metal silicide layer and formed to have a third depth greater than said second depth, wherein:
said first, second and third diffusion regions are formed of the same conductivity type.

6. The semiconductor device according to claim 5, further comprising:
a first sidewall insulating film provided to cover a side surface of said gate electrode; and
a second sidewall insulating film provided to cover a surface of said first sidewall insulating film,
said first diffusion region being formed using said gate electrode as a mask, said second diffusion region being formed using said first sidewall insulating film as a mask, said third diffusion region being formed using said second sidewall insulating film as a mask.

7. The semiconductor device according to claim 6, wherein said second sidewall insulating film is formed by an atmospheric CVD method.

* * * * *